(12) United States Patent
Yamaguchi

(10) Patent No.: US 9,111,759 B2
(45) Date of Patent: Aug. 18, 2015

(54) SEMICONDUCTOR DEVICE MANUFACTURING METHOD

(71) Applicant: FUJI ELECTRIC CO., LTD., Kawasaki-shi (JP)

(72) Inventor: Kazuya Yamaguchi, Matumoto (JP)

(73) Assignee: FUJI ELECTRIC CO., LTD. (JP)

( * ) Notice: Subject to any disclaimer, the term of this patent is extended or adjusted under 35 U.S.C. 154(b) by 124 days.

(21) Appl. No.: 14/051,511

(22) Filed: Oct. 11, 2013

(65) Prior Publication Data

US 2014/0106520 A1  Apr. 17, 2014

(30) Foreign Application Priority Data

Oct. 12, 2012  (JP) .................. 2012-227526

(51) Int. Cl.
 H01L 21/20  (2006.01)
 H01L 21/36  (2006.01)
 H01L 29/04  (2006.01)
 H01L 23/544  (2006.01)
 H01L 21/02  (2006.01)

(52) U.S. Cl.
 CPC ............ *H01L 29/045* (2013.01); *H01L 23/544* (2013.01); *H01L 21/0245* (2013.01); *H01L 21/0262* (2013.01); *H01L 21/02381* (2013.01); *H01L 21/02494* (2013.01); *H01L 21/02532* (2013.01); *H01L 21/02587* (2013.01); *H01L 2223/5442* (2013.01); *H01L 2223/54426* (2013.01); *H01L 2223/54453* (2013.01); *H01L 2924/0002* (2013.01)

(58) Field of Classification Search
 CPC ................. H01L 2223/54426; H01L 23/544; H01L 29/045
 See application file for complete search history.

(56) References Cited

U.S. PATENT DOCUMENTS

| | | | | |
|---|---|---|---|---|
| 4,894,349 A | * | 1/1990 | Saito et al. | ................ 117/93 |
| 5,865,888 A | * | 2/1999 | Min et al. | ................ 117/85 |
| 5,888,294 A | * | 3/1999 | Min et al. | ................ 117/84 |
| 2007/0010033 A1 | * | 1/2007 | Aderhold et al. | ........... 438/14 |
| 2007/0072397 A1 | | 3/2007 | Yamauchi et al. | |
| 2007/0082455 A1 | * | 4/2007 | Nogami et al. | ........... 438/424 |

(Continued)

FOREIGN PATENT DOCUMENTS

JP  2006-210934 A  8/2006
JP  2007-096138 A  4/2007

(Continued)

*Primary Examiner* — Bac Au

(74) *Attorney, Agent, or Firm* — Rossi, Kimms & McDowell LLP

(57) ABSTRACT

A semiconductor device manufacturing method with high productivity is disclosed with improved trade-off relationship between auto-doping and breakdown in alignment mark form. First to sixth epitaxial layers are grown sequentially on Si {100} main surface of an arsenic doped substrate using multilayer epitaxial technology. Epitaxial growth conditions of the first to sixth epitaxial layers are growth at atmospheric pressure and a temperature of 1,150° C. to 1,180° C., with epitaxial growth rate of 2.2 to 2.6 μm/minute. An alignment mark of depressed form whose bottom surface is the Si {100} plane is formed in the arsenic doped substrate. Every time one of the first to sixth epitaxial layers is grown on the main surface of the arsenic doped substrate, an alignment mark of depressed form is formed in the outermost epitaxial layer by a portion above the alignment mark of the layer below being transformed.

13 Claims, 10 Drawing Sheets

(56) References Cited

U.S. PATENT DOCUMENTS

2009/0273102 A1* 11/2009 Nogami et al. ............... 257/797
2010/0059815 A1* 3/2010 Grivna et al. ................. 257/330

FOREIGN PATENT DOCUMENTS

| JP | 2009-176784 A | 8/2009 |
| JP | 2012-089736 A | 5/2012 |

* cited by examiner

| ARSENIC DOPED SUBSTRATE MAIN SURFACE | FIRST ALIGNMENT MARK Si{100} | SECOND ALIGNMENT MARK Si{100} |
|---|---|---|
| NOTCH ORIENTATION | Si<110> | Si<100> |
| ALIGNMENT MARK PLAN VIEW | 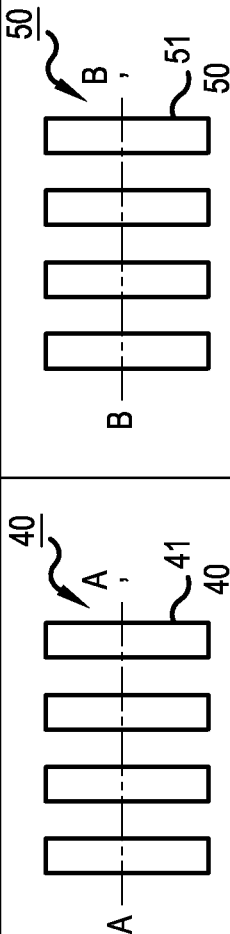 | 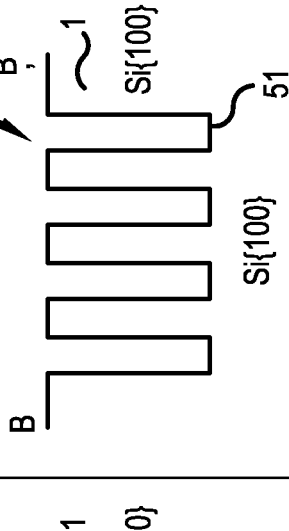 |
| ALIGNMENT MARK SECTIONAL VIEW | 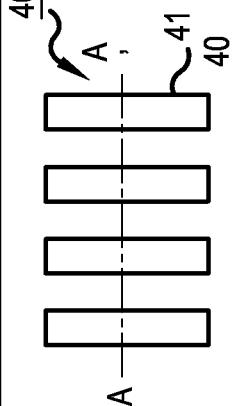 | 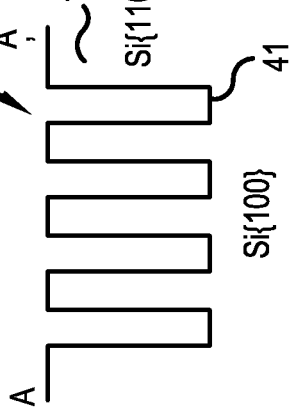 |
FIG.9

|  |  | ATMOSPHERIC PRESSURE (μm/min.) | | | | | |
| --- | --- | --- | --- | --- | --- | --- | --- |
|  |  | 1.5 | 2.0 | 2.2 | 2.4 | 2.6 | 2.8 |
| EPITAXIAL GROWTH TEMPERATURE [°C] | 1180 | x | x | ○ | ○ | ○ | ○ |
| | 1150 | x | ○ | ○ | ○ | ○ | ○ |
| | 1100 | ○ | ○ | ○ | ○ | ○ | ○ |
| | 1050 | ○ | ○ | ○ | ○ | ○ | ○ |

(NO AUTO-DOPING OCCURS: ○, AUTO-DOPING OCCURS: x)

FIG.10

|  | | ATMOSPHERIC PRESSURE (μm/min.) | | | | | |
|---|---|---|---|---|---|---|---|
|  | | 1.5 | 2.0 | 2.2 | 2.4 | 2.6 | 2.8 |
| EPITAXIAL GROWTH TEMPERATURE [°C] | 1180 | ○ | ○ | ○ | ○ | x | x |
|  | 1150 | ○ | ○ | ○ | ○ | x | x |
|  | 1100 | x | x | x | x | x | x |
|  | 1050 | x | x | x | x | x | x |

(NO AUTO-DOPING OCCURS: ○, AUTO-DOPING OCCURS: x )

FIG.11

|  | | ATMOSPHERIC PRESSURE (μm/min.) | | | | | |
|---|---|---|---|---|---|---|---|
|  | | 1.5 | 2.0 | 2.2 | 2.4 | 2.6 | 2.8 |
| EPITAXIAL GROWTH TEMPERATURE [°C] | 1180 | ⊗ | ⊗ | ⊗ | ⊗ | ⊗ | ⊗ |
|  | 1150 | ⊗ | ⊗ | ⊗ | ⊗ | ⊗ | ⊗ |
|  | 1100 | ⊗ | ⊗ | ⊗ | ⊗ | ⊗ | ⊗ |
|  | 1050 | ⊗ | ⊗ | ⊗ | ⊗ | ⊗ | ⊗ |

(NO AUTO-DOPING OCCURS: ○, AUTO-DOPING OCCURS: x )

FIG.12

|  | EPITAXIAL GROWTH TEMPERATURE [°C] | | |
|---|---|---|---|
|  | 1050°C | 1100°C | 1150°C |
| 10μm (FIRST TIME) | x | ○ | ○ |
| 17μm (SECOND TIME) | x | x | ○ |
| 24μm (THIRD TIME) | x | x | x |
| NUMBER OF TIMES ALIGNMENT MARK FORWARD | NOT APPLICABLE | 5 | 3 |

(NO AUTO-DOPING OCCURS: ○, AUTO-DOPING OCCURS: x )

FIG.13

SEMICONDUCTOR DEVICE MANUFACTURING METHOD

BACKGROUND OF THE INVENTION

A. Field of the Invention

The present invention relates to a semiconductor device manufacturing method.

B. Description of the Related Art

To date, trench filling epitaxial technology has been known as a method of manufacturing a semiconductor device (hereafter referred to as a super junction semiconductor device) wherein the drift layer is a parallel p-n layer in which an n-type region with an increased impurity concentration and a p-type region are disposed alternately. Trench filling epitaxial technology is such that an n-type epitaxial film is formed on an n+ type silicon substrate, and a trench is formed in the n-type epitaxial film. A p-type epitaxial film is deposited on the n-type epitaxial film, including the inside of the trench, thus filling the trench with the p-type epitaxial film (for example, refer to JP-A-2007-096138).

Also, multilayer epitaxial technology is known as another method of forming a parallel p-n layer. Multilayer epitaxial technology is such that a parallel p-n layer is formed by epitaxial growth of an n-type semiconductor layer for forming an n-type drift region and selective ion implantation of a p-type impurity for forming a p-type region being repeatedly carried out (for example, refer to JP-A-2012-089736). Controllability of the impurity ratio (hereafter referred to as the p/n ratio) between the p-type region (p-type semiconductor layer) and n-type semiconductor layer of the parallel p-n layer is higher with the multilayer epitaxial technology than with the trench filling epitaxial technology.

A super junction MOSFET (insulated-gate field-effect transistor) is such that a parallel p-n layer is formed on a low resistance $n^+$ type silicon substrate doped with arsenic (As) or antimony (Sb) (hereafter referred to as an arsenic doped substrate). As the arsenic doped substrate can be doped with an n-type impurity to a high concentration, it is possible to omit back surface processes, such as an implantation of ions into the substrate back surface and an annealing process in order to obtain an ohmic contact, and thus possible to reduce the number of steps.

However, when forming a parallel p-n layer by growing an epitaxial layer on the front surface of the arsenic doped substrate, so-called auto-doping, wherein arsenic in the arsenic doped substrate diffuses outward from the substrate back surface to the gas atmosphere and is taken into the epitaxial layer during growth, is likely to occur. As it is important to accurately control the parallel p-n layer p/n ratio when manufacturing a super junction MOSFET, there is a problem in that controllability of the parallel p-n layer p/n ratio decreases when auto-doping occurs.

A method whereby a silicon epitaxial layer is grown by low pressure chemical vapor deposition on the main surface of an underlying silicon wafer to which a dopant of arsenic, phosphorus, or boron is added to a concentration of $1.0 \times 10^{19}/cm^3$ or more, with the growth temperature in a range of 1,000 to 1,100 C, and moreover, with the pressure in a reaction chamber of a growth gas including $SiH_4$ gas in a range of 1,999.83 Pa (15 Torr) to 2,666.44 Pa (20 Torr), has been proposed as a method of preventing auto-doping (for example, refer to JP-A-2009-176784).

By carrying out epitaxial growth at a low temperature of 1,100 C or less, as in JP-A-2009-176784, the impurity amount of arsenic diffusing outward from the arsenic doped substrate into the gas atmosphere is reduced. Also, by carrying out epitaxial growth in a low pressure atmosphere, as in JP-A-2009-176784, the flow of gas inside the chamber increases in speed, and arsenic diffusing outward from the arsenic doped substrate into the gas atmosphere is discharged to the exterior of the chamber before being taken into the epitaxial layer.

Also, a method whereby, as an aspect of a method of manufacturing an epitaxial wafer having a buried ion implanted layer, ion implantation such that a pre-implantation oxidation process is eliminated is realized by carrying out heat treatment for post-ion implantation crystal recovery in a hydrogen atmosphere, and as a result of an active oxide film formation process including pre-implantation oxidation carried out on an epitaxial layer being eliminated, the number of times heat is applied to the buried ion implanted layer decreases, and lateral diffusion is effectively suppressed, has been proposed as another method of preventing auto-doping (for example, refer to JP-A-2006-210934).

SUMMARY OF THE INVENTION

However, when carrying out epitaxial growth at low temperature using multilayer epitaxial technology, the inside of an alignment mark with a depressed form formed in an underlying epitaxial layer is filled with the epitaxial layer above. As a result, the form of an alignment mark newly formed in the epitaxial layer above breaks down to a considerable extent. Because of this, an exposure device is unable to recognize the alignment mark when patterning during selective ion implantation for selectively forming a p-type region in an n-type epitaxial layer, and a problem occurs in that it is not possible to carry out patterning positioning (alignment). Consequently, the number of times an additional step for forming an alignment mark is carried out after growing an epitaxial layer increases.

In this way, there is a trade-off relationship between preventing auto-doping and preventing a breakdown in alignment mark form. As it is possible to prevent both auto-doping and a breakdown in alignment mark form when carrying out epitaxial growth in a low pressure atmosphere (for example, 20 Torr) using multilayer epitaxial technology, there is no trade-off relationship. However, epitaxial growth rate in a low pressure atmosphere is such that atmospheric pressure is low compared with epitaxial growth in an atmospheric pressure (in the region of, for example, 760 Torr), and the frequency of maintenance increases due to sediment on the chamber side walls and discharge pipe, and so on, because of which there is a problem in that productivity deteriorates.

The invention, in order to eliminate the heretofore described problems with the heretofore known technology, provides a semiconductor device manufacturing method such that it is possible to improve the trade-off relationship between auto-doping and breakdown in alignment mark form. The invention, in order to eliminate the heretofore described problems with the heretofore known technology, provides a semiconductor device manufacturing method with high productivity.

In order to solve the heretofore described problems, a semiconductor device manufacturing method according to an aspect of the invention has the following characteristics. Firstly, a first step of forming a first alignment mark in one portion of a semiconductor substrate doped with $1.0 \times 10^{19}/cm^3$ or more of arsenic is carried out. Next, a second step of forming a second alignment mark by an epitaxial layer being grown on a main surface of the semiconductor substrate, and a portion of the epitaxial layer above the first alignment mark being transformed in accordance with the first alignment mark, is carried out. The epitaxial layer is grown in the second step at atmospheric pressure using trichlorosilane as a raw material gas, with an epitaxial growth temperature of 1,150° C. to 1,180° C., and an epitaxial growth rate of 2.2 μm per minute to 2.6 μm per minute.

Also, the semiconductor device manufacturing method according to the aspect of the invention is such that the first alignment mark formed in one portion of the semiconductor substrate in the first step is of a depressed form. Further, the main surface of the semiconductor substrate is the {100} plane, and the bottom surface of the first alignment mark is the {100} plane.

Also, the semiconductor device manufacturing method according to the aspect of the invention is such that the first alignment mark formed in one portion of the semiconductor substrate in the first step is of a depressed form. Further, the main surface of the semiconductor substrate is the {100} plane, and the side surface of the first alignment mark is the {100} plane.

Also, the semiconductor device manufacturing method according to the aspect of the invention further includes a third step of, after the second step, forming a trench in the epitaxial layer in accordance with the second alignment mark, and forming an insulated gate structure inside the trench.

Also, the semiconductor device manufacturing method according to the aspect of the invention is such that the trench is formed in the third step so that the side surface of the trench is the {100} plane.

Also, the semiconductor device manufacturing method according to the aspect of the invention is such that a fourth step of, after the second step and before the third step, introducing a first conductivity type impurity into the epitaxial layer, and furthermore, selectively introducing a second conductivity type impurity, is further carried out. The thickness of the epitaxial layer is increased by repeatedly carrying out the second step and fourth step, and a parallel p-n junction structure is formed with a configuration wherein a first conductivity type semiconductor region and a second conductivity type semiconductor region are repeatedly alternately joined.

Also, the semiconductor device manufacturing method according to the aspect of the invention is such that the semiconductor substrate is a substrate wherein a first conductivity type epitaxial layer is deposited on a semiconductor wafer doped with arsenic to a dose of $1.0 \times 10^{19}/cm^3$ or more.

Also, the semiconductor device manufacturing method according to the aspect of the invention is such that a first repeat step of repeatedly carrying out the second step, thereby forming the epitaxial layer to a thickness of 14 μm or less, is carried out. Next, a third step of, after the second step, selectively introducing a second conductivity type impurity into the epitaxial layer using the second alignment mark is carried out.

Also, the semiconductor device manufacturing method according to the aspect of the invention is such that a fourth step of, after the first repeat step, forming a third alignment mark on the surface of the epitaxial layer using the second alignment mark is further carried out. Further, a fifth step of forming a fourth alignment mark by an epitaxial layer being further grown on the surface of the epitaxial layer in which the third alignment mark has been formed, and a portion of the epitaxial layer above the third alignment mark being transformed in accordance with the third alignment mark, is carried out. The epitaxial layer is grown in the fifth step at atmospheric pressure using trichlorosilane as a raw material gas, with an epitaxial growth temperature of 1,150° C. to 1,180° C., and an epitaxial growth rate of 2.2 μm per minute to 2.6 μm per minute.

Also, the semiconductor device manufacturing method according to the aspect of the invention is such that a second repeat step of repeatedly carrying out the fifth step, thereby forming an epitaxial layer to a thickness of 14 μm or less on the surface of the epitaxial layer in which the third alignment mark has been formed, is carried out. Further, a sixth step of, after the fifth step, selectively introducing a second conductivity type impurity using the fourth alignment mark is carried out.

Also, the semiconductor device manufacturing method according to the aspect of the invention is such that the thickness of the epitaxial layer is increased by carrying out the third step after each second step and carrying out the sixth step after each fifth step, and a parallel p-n junction structure is formed with a configuration wherein a first conductivity type semiconductor region and a second conductivity type semiconductor region are repeatedly alternately joined.

According to the invention, it is possible to prevent auto-doping by epitaxial layers being grown on the main surface of an arsenic doped substrate at atmospheric pressure, with the epitaxial growth temperature at 1,150° C. to 1,180° C., and the epitaxial growth rate at 2.2 μm per minute to 2.6 μm per minute. Also, according to the invention, it is possible to prevent a breakdown in the form of an alignment mark newly formed in an epitaxial layer grown on the main surface of an arsenic doped substrate in which an alignment mark is formed. Also, according to the invention, it being possible to prevent breakdown in alignment mark form means that it is possible to reduce the number of times an additional step for forming an alignment mark is carried out compared with that heretofore known.

According to the semiconductor device manufacturing method according to the invention, an advantage is achieved in that it is possible to improve the trade-off relationship between auto-doping and breakdown in alignment mark form. According to the semiconductor device manufacturing method according to the invention, an advantage is achieved in that it is possible to improve productivity.

BRIEF DESCRIPTION OF THE DRAWINGS

The foregoing advantages and features of the invention will become apparent upon reference to the following detailed description and the accompanying drawings, of which:

FIG. 9 is an illustration schematically showing alignment mark forms resulting from a semiconductor device manufacturing method according to the embodiment;

FIG. 10 is a table showing the relationship between the epitaxial growth temperature and an epitaxial growth rate and auto-doping;

FIG. 11 is a table showing the relationship between the epitaxial growth temperature and an epitaxial growth rate and a first alignment mark;

FIG. 12 is a table showing the relationship between the epitaxial growth temperature and an epitaxial growth rate and a second alignment mark;

FIG. 13 is a table showing the relationship between the epitaxial growth temperature and the number of additional alignment mark formation steps;

DETAILED DESCRIPTION OF SPECIFIC EMBODIMENTS

Hereafter, with reference to the attached drawings, a detailed description will be given of a preferred embodiment of a semiconductor device manufacturing method according to the invention. In the description and attached drawings, a layer or region being prefixed by n or p indicates that electrons or holes respectively are majority carriers. Also, + or – being added to n or p indicates a higher impurity concentration or lower impurity concentration respectively than that in a layer or region to which neither is added. The same reference signs are given to the same configurations in the following embodiment description and attached drawings, and redundant descriptions are omitted.

Embodiment

Figure 1:
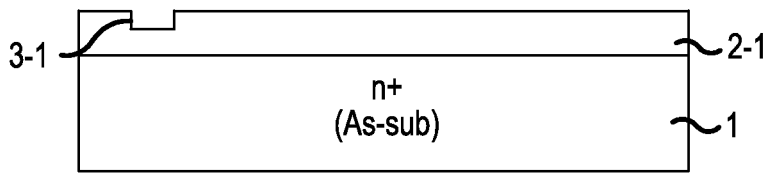
FIG. 1 is a sectional view showing a condition partway through the manufacture of a semiconductor device according to an embodiment.

A description will be given of the semiconductor device manufacturing method according to the embodiment, with a case of fabricating a super junction MOSFET as an example. FIGS. 1 to 7 are sectional views showing conditions partway through the manufacture of a semiconductor device according to the embodiment. Firstly, arsenic (As) doped low resistance n$^+$ type silicon substrate (an arsenic doped substrate) 1 is prepared, as shown in FIG. 1. Arsenic doped substrate 1 has a resistivity of, for example, in the region of 1 mΩcm to 4 mΩcm (a doping concentration of in the region of $1.0 \times 10^{19}/cm^3$). A semiconductor substrate of the invention may be such that an epitaxial layer of the same conductivity (a first epitaxial layer 2-1) is deposited on arsenic doped substrate 1.

Next, for example, arsenic doped substrate 1 is mounted on a stage (not shown) provided inside an epitaxial growth device reaction chamber. Then, a raw material gas and a carrier gas are supplied to the inside of the chamber and, in a condition wherein arsenic doped substrate 1 has been heated so as to reach a predetermined temperature, the intrinsic first epitaxial layer 2-1 is grown on a main surface of arsenic doped substrate 1. The growth conditions of first epitaxial layer 2-1 are the same as the growth conditions of, for example, second epitaxial layer 2-2. Next, a photoresist (not shown) is applied on first epitaxial layer 2-1. Next, the photoresist is selectively removed using photolithography, thereby forming a resist mask (an etching mask) wherein a portion corresponding to a region in which an alignment mark is to be formed is exposed.

Figure 2:
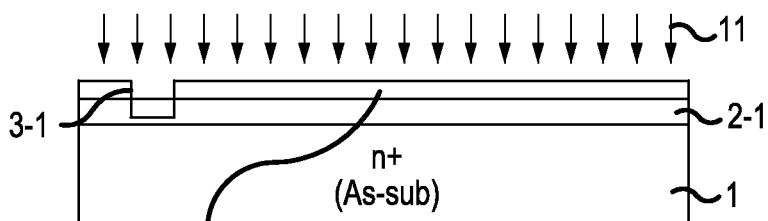
FIG. 2 is a sectional view showing a condition partway through the manufacture of a semiconductor device according to an embodiment.

Next, first epitaxial layer 2-1 is etched with the resist mask as a mask, thereby forming alignment mark 3-1 in first epitaxial layer 2-1. Alignment mark 3-1 is used, for example, in positioning a mask when carrying out exposure in a photolithography step (the same also applies to other alignment marks). A preferred form of the alignment mark will be described hereafter. Next, first ion implantation 11 of an n-type impurity such as phosphorus (P) is carried out over the whole of first epitaxial layer 2-1, as shown in FIG. 2. By so doing, n-type impurity region (hereafter referred to as a first n-type implant region) 4-1, formed of the n-type impurity subjected to first ion implantation 11, is formed in a surface layer of first epitaxial layer 2-1.

Figure 3:
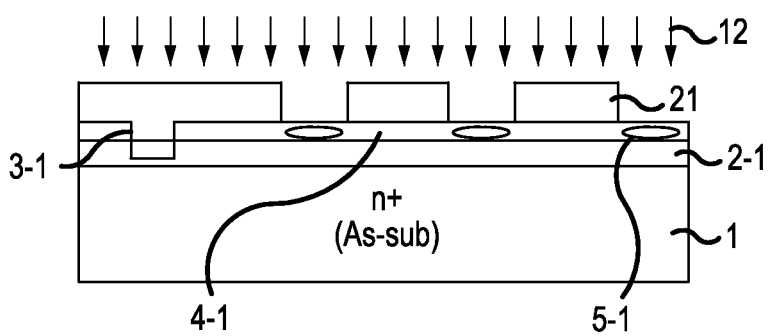
FIG. 3 is a sectional view showing a condition partway through the manufacture of a semiconductor device according to an embodiment.

Next, resist mask (an ion implantation mask) 21 in which the surface of first epitaxial layer 2-1 is exposed at predetermined intervals is formed by photolithography on the surface of first epitaxial layer 2-1, as shown in FIG. 3. Alignment mark 3-1 is used in the mask positioning (alignment) when carrying out exposure in this photolithography step. Next, with resist mask 21 as a mask, second ion implantation 12 of a p-type impurity such as boron (B) is carried out into first epitaxial layer 2-1. By so doing, p-type impurity region (hereafter referred to as a first p-type implant region) 5-1, formed of the p-type impurity subjected to second ion implantation 12, is selectively formed inside first n-type implant region 4-1.

Figure 4:
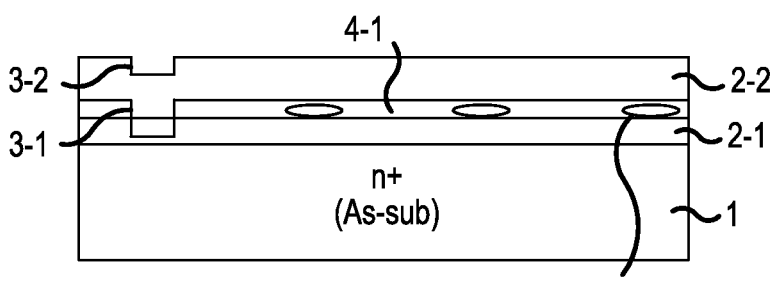
FIG. 4 is a sectional view showing a condition partway through the manufacture of a semiconductor device according to an embodiment.

Next, after detaching resist mask 21, intrinsic second epitaxial layer 2-2 is additionally grown on the surface of first epitaxial layer 2-1, as shown in FIG. 4. At this time, second epitaxial layer 2-2 is embedded in alignment mark 3-1. As second epitaxial layer 2-2 is grown to an even thickness, a surface of second epitaxial layer 2-2 (the surface on the side opposite to arsenic doped substrate 1 side: the outermost epitaxial layer surface) is of a condition such that it is depressed to the same extent as alignment mark 3-1 above alignment mark 3-1. The depressed portion formed in second epitaxial layer 2-2 forms alignment mark 3-2.

In this way, without carrying out additional steps for forming an alignment mark (photolithography for forming an etching mask, a step of etching first epitaxial layer 2-1 with the etching mask as a mask, and the like), it is possible to form alignment mark 3-2 in second epitaxial layer 2-2 simply by forming the epitaxial layer.

It is preferable that the epitaxial growth conditions of the second epitaxial layer 2-2 are such that, at atmospheric pressure (for example, in the region of 760 Torr), the epitaxial growth temperature is 1,150° C. to 1,180° C., while the epitaxial growth rate is 2.2 μm per minute to 2.6 μm per minute. The reasons for this are that it is possible to prevent arsenic diffusing to the exterior from inside the arsenic doped substrate 1 from being taken into the epitaxial layer during growth (auto-doping), prevent breaking down of the form of an alignment mark formed by an epitaxial growth step alone, to be described hereafter, and improve productivity.

Specifically, by carrying out epitaxial growth at atmospheric pressure, it is possible to increase the epitaxial growth rate in comparison with that of epitaxial growth in a low pressure atmosphere, whereby productivity improves. Also, by the epitaxial growth temperature and the epitaxial growth rate being within the heretofore described ranges, it is possible to prevent both auto-doping and a breakdown in alignment mark form. Also, it is not desirable that the epitaxial growth temperature is higher than 1,180° C., as the amount of sediment deposited on the chamber side walls and discharge pipe increases. Also, although productivity improves further the more the epitaxial growth rate is increased, it is not desirable that the epitaxial growth rate is greater than 2.8 μm per minute, as crystal defects increase and quality deteriorates.

Figure 5:
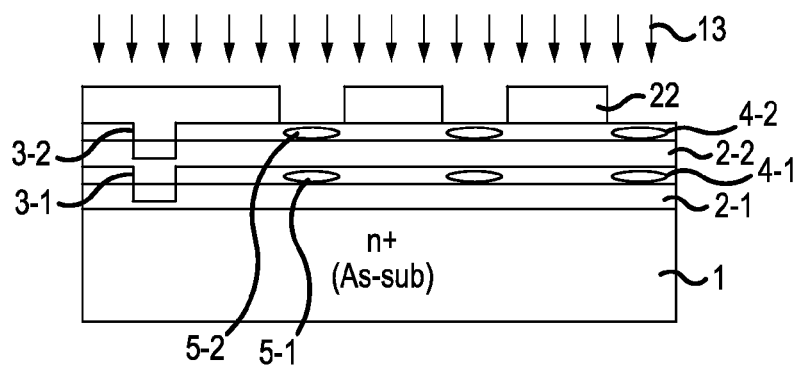
FIG. 5 is a sectional view showing a condition partway through the manufacture of a semiconductor device according to an embodiment.

Next, a third ion implantation (not shown) of an n-type impurity is carried out over the whole of second epitaxial layer 2-2 in the same way as first ion implantation 11 into first epitaxial layer 2-1, thereby forming second n-type implant region 4-2 in a surface layer of second epitaxial layer 2-2, as shown in FIG. 5. Next, resist mask 22 with which the surface of second epitaxial layer 2-2 is exposed at predetermined intervals is formed by photolithography on the surface of second epitaxial layer 2-2. Alignment mark 3-2 is used in the mask positioning when carrying out exposure in this photolithography step. Because of this, a portion of second epitaxial layer 2-2 above first p-type implant region 5-1 is exposed in an aperture portion of resist mask 22.

Next, with resist mask 22 as a mask, fourth ion implantation 13 of a p-type impurity is carried out into second epitaxial layer 2-2. By so doing, second p-type implant region 5-2 is selectively formed above first p-type implant region 5-1 inside second n-type implant region 4-2. Next, steps the same as the steps of forming second epitaxial layer 2-2, second n-type implant region 4-2, and second p-type implant region 5-2 are repeatedly carried out (multilayer epitaxial technology), whereby a plurality of epitaxial layers in which are formed an n-type implant region and p-type implant region are stacked. A condition wherein, for example, six epitaxial layers (first to sixth epitaxial layers 2-1 to 2-6) are stacked on the main surface of the arsenic doped substrate 1 is shown in FIG. 6.

Figure 6:
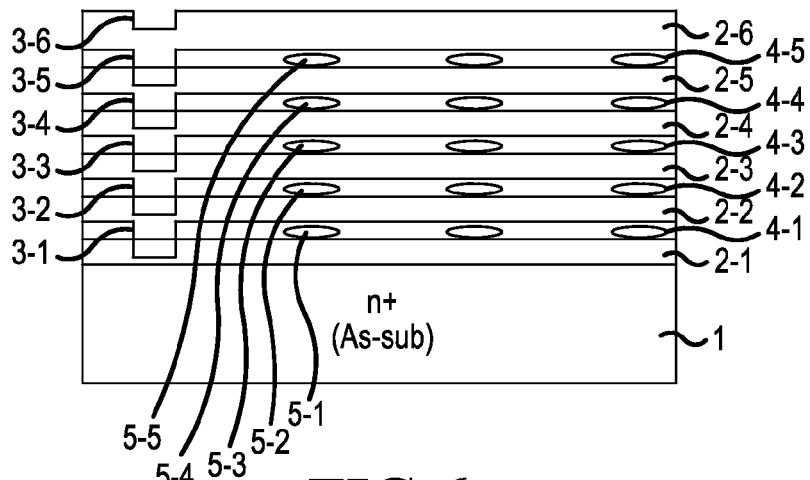
FIG. 6 is a sectional view showing a condition partway through the manufacture of a semiconductor device according to an embodiment.

Every time an epitaxial layer is deposited on the surface of first epitaxial layer 2-1, the outermost epitaxial layer surface is of a condition such that it is depressed above the alignment mark of the layer below, as shown in FIG. 6. Because of this, a new alignment mark (alignment marks 3-3 to 3-6) is formed in the epitaxial layer forming the outermost layer (indicated by the upward arrow in FIG. 7), without carrying out additional steps for forming an alignment mark. Also, n-type implant regions (third to fifth n-type implant regions 4-3 to 4-5) and p-type implant regions (third to fifth p-type implant regions 5-3 to 5-5) are formed in third to fifth epitaxial layers 2-3 to 2-5 before the step of forming the epitaxial layer forming the layer above.

Figure 7:
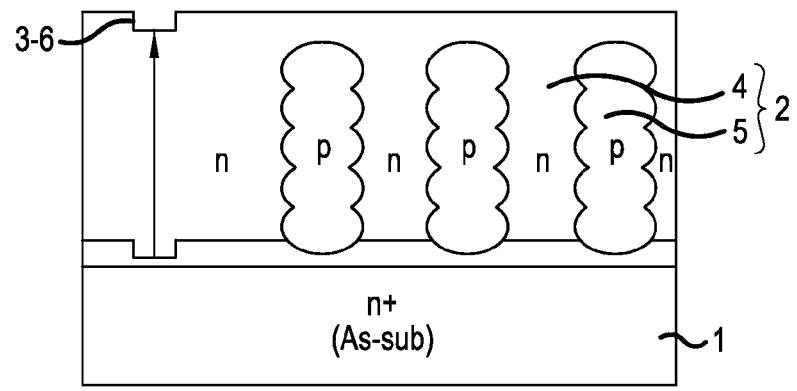
FIG. 7 is a sectional view showing a condition partway through the manufacture of a semiconductor device according to an embodiment.

Next, first to fifth n-type implant regions 4-1 to 4-5 and first to fifth p-type implant regions 5-1 to 5-5 are diffused (driven in) by heat treatment, as shown in FIG. 7. Those of first to fifth n-type implant regions 4-1 to 4-5 opposing each other in the depth direction are joined by the heat treatment, whereby n-type region 4 penetrating first to sixth epitaxial layers 2-1 to 2-6 is formed. Also, those of first to fifth p-type implant regions 5-1 to 5-5 opposing each other in the depth direction are joined, whereby p-type region 5 penetrating first to sixth epitaxial layers 2-1 to 2-6 is formed.

Consequently, first to sixth epitaxial layers 2-1 to 2-6 become parallel p-n layer 2 wherein n-type region (hereafter referred to as an n-type drift region) 4 and p-type region (hereafter referred to as a p-type partition region) 5 are alternately disposed. Subsequently, by a desired element structure such as a MOS gate (an insulated gate formed of a metal-oxide-semiconductor) structure being formed on parallel p-n layer 2 and arsenic doped substrate 1, the semiconductor device according to the embodiment is completed.

Figure 8:
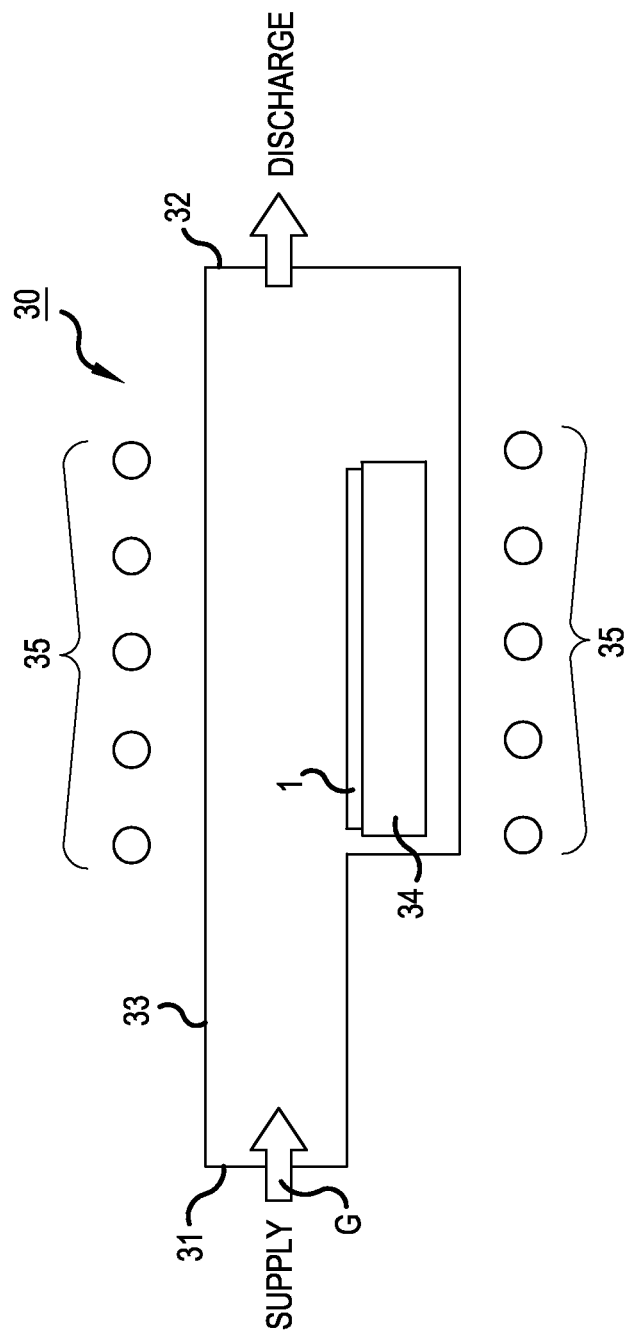
FIG. 8 is a sectional view schematically showing a semiconductor manufacturing device according to the embodiment.

Next, as an example of a configuration of an epitaxial growth device, a description will be given using a horizontal epitaxial growth device wherein, for example, arsenic doped substrate 1 is disposed horizontally. FIG. 8 is a sectional view schematically showing a semiconductor manufacturing device according to the embodiment. Epitaxial growth device 30 includes a chamber 33, susceptor 34 on which arsenic doped substrate 1 is mounted, and lamp heater 35 that heats arsenic doped substrate 1. Supply inlet 31 through which a raw material gas G and a carrier gas are supplied, and outlet 32 through which gas is discharged after a reaction, are provided in chamber 33. The raw material gas G flows horizontally over the main surface of arsenic doped substrate 1 in chamber 33 when epitaxial growth is carried out on the main surface of arsenic doped substrate 1.

Susceptor 34 is disposed between supply inlet 31 and outlet 32 in chamber 33. Arsenic doped substrate 1 is disposed horizontal to susceptor 34 on susceptor 34. Lamp heater 35 is disposed above susceptor 34, and heats arsenic doped substrate 1 from the side of arsenic doped substrate 1 opposite to susceptor 34 side. Also, lamp heater 35 is disposed below susceptor 34, and heats arsenic doped substrate 1 through susceptor 34. Epitaxial growth device 30 is such that an epitaxial layer is grown on the main surface of arsenic doped substrate 1 by arsenic doped substrate 1 being disposed horizontal to susceptor 34, and the raw material gas G being caused to flow in one direction in chamber 33 while arsenic doped substrate 1 is heated by lamp heater 35.

Next, a description will be given of a preferred form of an alignment mark. FIG. 9 is an illustration schematically showing alignment mark forms resulting from the semiconductor device manufacturing method according to the embodiment. FIG. 9 shows two kinds of preferred alignment mark (hereafter referred to as first and second alignment marks) 40 and 50 resulting from the semiconductor device manufacturing method according to the embodiment. First and second alignment marks 40 and 50 shown in FIG. 9 are examples showing forms of alignment marks formed in an epitaxial layer in an additional step for forming an alignment mark. Hereafter, the description will be given taking as an example a case wherein first and second alignment marks 40 and 50 are formed in arsenic doped substrate 1.

As shown in FIG. 9, first alignment mark 40 is configured of a plurality of grooves 41 formed in arsenic doped substrate 1, which has the Si{100} plane as the main surface. The orientation (notch orientation) of an orientation flat (not shown) of arsenic doped substrate 1 is the Si<110> direction. The side walls of grooves 41 are formed parallel to the orientation flat of arsenic doped substrate 1, and are the Si{110} plane. Consequently, the crystal planes of the side walls and bottom surface of grooves 41 configuring first alignment mark 40 are the Si{110} plane and Si{100} plane respectively. The side walls of grooves 41 are side walls perpendicular to the direction in which the plurality of grooves 41 are aligned. First alignment mark 40 has a striped planar form extending in a direction perpendicular to the direction in which grooves 41 are aligned (a direction toward the rear in the plane of FIG. 9).

Second alignment mark 50 is configured of a plurality of grooves 51 formed in arsenic doped substrate 1, which has the Si{100} plane as the main surface. The orientation of an orientation flat (not shown) of arsenic doped substrate 1 is the Si<100> direction. The side walls of grooves 51 are formed parallel to the orientation flat of arsenic doped substrate 1, and are the Si{100} plane. Consequently, the crystal planes of the side walls and bottom surface of grooves 51 configuring second alignment mark 50 are both the Si{100} plane. The side walls of grooves 51 are side walls perpendicular to the direction in which the plurality of grooves 51 are aligned. Second alignment mark 50 has a striped planar form extending in a direction perpendicular to the direction in which grooves 51 are aligned (a direction toward the rear in the plane of FIG. 9). That is, second alignment mark 50 is disposed so that the orientation of the orientation flat and the crystal plane of the side walls of grooves 51 are vertical.

By qualifying the crystal planes as with first and second alignment marks 40 and 50, it is possible to prevent breakdown in alignment mark form. Also, when fabricating (manufacturing) a semiconductor device with a trench gate structure, the trench gate structure is formed so that the orientation of the side walls of trenches configuring the trench gate structure and the orientation of an orientation flat of arsenic doped substrate 1 are both the Si<100> direction. Because of this, it is preferable that second alignment mark 50 is employed as the alignment mark used when fabricating a semiconductor device with a trench gate structure, and that the alignment mark is formed so that the side walls of grooves 51 configuring second alignment mark 50 and the side walls of the trenches configuring the trench gate structure are parallel. The trench side walls are side walls perpendicular to the direction in which the plurality of trenches are aligned.

EXAMPLE 1

Next, auto-doping was verified. FIG. 10 is a table showing the relationship between the epitaxial growth temperature and an epitaxial growth rate and auto-doping. Firstly, a plurality of specimens wherein an intrinsic epitaxial layer was grown to a thickness of 7 μm on the main surface of arsenic doped substrate 1 were fabricated in accordance with the semiconductor device manufacturing method according to the embodiment. Specifically, a total of 24 specimens were fabricated under six conditions of epitaxial growth rates—1.5 μm per minute, 2.0 μm per minute, 2.2 μm per minute, 2.4 μm per minute, 2.6 μm per minute, and 2.8 μm per minute—for each of four conditions of epitaxial growth temperature—1,050° C., 1,100° C., 1,150° C., and 1,180° C.

A silicon substrate with a diameter of 6 inches, an arsenic concentration of $2.25 \times 10^{19}/cm^3$ to $7.4 \times 10^{19}/cm^3$, and resistivity of 1 mΩcm to 4 mΩcm was prepared as arsenic doped substrate 1. The raw material gas G and carrier gas supplied to chamber 33 were trichlorosilane (TCS) and hydrogen ($H_2$, 50 ml) respectively. Then, using a spreading resistance measuring instrument (SR measuring instrument), the depth direction impurity concentration profile was measured in a central portion of the epitaxial layer, and in a portion 5 mm inward from the outer periphery, of each specimen. The results thereof are shown in FIG. 10. In FIG. 10, a circle (O) indicates that there is no auto-doping, while a cross (x) indicates that there is auto-doping. No auto-doping means a case wherein the impurity concentration as far as a depth of 3 μm from the epitaxial layer surface (the surface on the side opposite to the arsenic doped substrate 1 side) is $5.0 \times 10^{13}/cm^3$ or less. $5.0 \times 10^{13}/cm^3$ corresponds to 1% of the impurity concentration of parallel p-n layer 2.

It was confirmed from the results shown in FIG. 10 that it is possible to prevent auto-doping by adopting an epitaxial growth rate of 2.2 μm per minute or more (the portion surrounded by the heavy line), even when the epitaxial growth temperature is high at 1,050° C. or more. It is supposed that the reason for this is as follows. Silicon atoms in the raw material gas G, and arsenic atoms diffusing outward into the gas atmosphere from inside arsenic doped substrate 1, continuously accumulate on the epitaxial layer surface during growth in accordance with the crystal lattice of arsenic doped substrate 1. At this time, it is supposed that the reaction between the silicon atoms in the raw material gas G and the epitaxial layer surface becomes more vigorous owing to the epitaxial growth temperature being increased, while the reaction between the arsenic atoms and the epitaxial layer surface is suppressed.

EXAMPLE 2

Next, the results of a verification of the first alignment mark 40 are shown in FIG. 11. FIG. 11 is a table showing the relationship between the epitaxial growth temperature and the epitaxial growth rate and the first alignment mark. Firstly, a plurality of specimens wherein an intrinsic epitaxial layer was grown to a thickness of 10 μm on the main surface of arsenic doped substrate 1, which has the Si{100} plane as the main surface, were fabricated. The epitaxial growth temperature and the epitaxial growth rate are the same as in Example 1. That is, 24 specimens with differing epitaxial growth temperatures and epitaxial growth rates were fabricated. Conditions other than the plane orientation of arsenic doped substrate 1 are the same as in Example 1.

Specifically, each specimen was fabricated by making first epitaxial layer 2-1 grow to a thickness of 3 μm on the main surface of arsenic doped substrate 1 and, after alignment mark 3-1 was formed in first epitaxial layer 2-1, making second epitaxial layer 2-2 grow to a thickness of 7 μm. Alignment mark 3-1 (an enhanced global alignment mark (EGA mark)) formed in first epitaxial layer 2-1 was first alignment mark 40 formed of the four grooves 41. The width of grooves 41 in the direction in which grooves 41 were aligned (hereafter referred to as the lateral direction width) was 4 μm. The width of grooves 41 in a direction perpendicular to the direction in which grooves 41 were aligned (hereafter referred to as the longitudinal direction width) was 45 μm. Grooves 41 were disposed at intervals of 8 μm. The depth of grooves 41 was 0.5 μm.

Next, alignment mark 3-2 formed in second epitaxial layer 2-2 was detected in each specimen using an exposure device, based on alignment mark 3-1 of first epitaxial layer 2-1, and it was determined whether or not form breakdown had occurred. Whether or not a breakdown in alignment mark form had occurred was determined based on superposition accuracy when patterning. Specifically, it is taken that "no breakdown in alignment mark form has occurred" when the amount of deviation between alignment mark 3-1 formed in first epitaxial layer 2-1 and alignment mark 3-2 formed in second epitaxial layer 2-2 grown on first epitaxial layer 2-1 surface in a direction parallel to arsenic doped substrate 1 main surface is within ±0.2 μm.

Meanwhile, when the heretofore described amount of deviation is greater than ±0.2 μm, it is determined that "a breakdown in alignment mark form has occurred". In FIG. 11, a case in which no breakdown in alignment mark form has occurred is shown as "Alignment possible" (O), while a case in which a breakdown in alignment mark form has occurred is shown as "Alignment not possible" (x) (the same also applies in FIGS. 12 and 13). This amount of deviation is a range wherein the alignment mark is recognizable by, for example, an exposure device, and a range wherein no problem occurs in element characteristics when aligning (positioning) using the alignment mark. A Nikon NSR i14 (registered trademark), which detects an alignment mark using the EGA method, was used as the exposure device.

Specifically, the alignment mark is detected by the planar form of the alignment mark being photographed by a camera included in the exposure device, and the width and disposition pitch of the alignment mark being ascertained by the contrast (light and dark) of the image. From the results shown in FIG. 11, it was confirmed that alignment is not possible when the epitaxial growth temperature is 1,050° C. or 1,100° C. (the portion surrounded by the broken lines), regardless of the epitaxial growth rate. As opposed to this, it was confirmed that alignment is possible when the epitaxial growth temperature is 1,150° C. or 1,180° C. and the epitaxial growth rate is 2.4 μm per minute or less.

Consequently, it was confirmed from the results shown in FIGS. 10 and 11 that it is possible to prevent both auto-doping and a breakdown in alignment mark form by first alignment mark 40 being formed in arsenic doped substrate 1, the epitaxial growth temperature when growing an epitaxial layer arsenic doped substrate 1 being 1,150° C. to 1,180° C., and the epitaxial growth rate being 2.2 μm per minute to 2.4 μm per minute (the portion surrounded by the heavy solid line in FIG. 11).

EXAMPLE 3

Next, the results of a verification of the second alignment mark 50 are shown in FIG. 12. FIG. 12 is a table showing the relationship between the epitaxial growth temperature and the epitaxial growth rate and the second alignment mark. Example 3 differs from Example 2 in that alignment mark 3-1 formed in the first epitaxial layer 2-1 is second alignment mark 50 formed of the four grooves 51. The lateral direction width, longitudinal direction width, and disposition interval of grooves 51 configuring second alignment mark 50 are the same as those of grooves 41 configuring first alignment mark 40 in Example 2. The other conditions of Example 3 are the same as in Example 2. That is, 24 specimens with differing epitaxial growth temperatures and epitaxial growth rates was fabricated, using arsenic doped substrate 1 in which second alignment mark 50 was formed.

Then, in the same way as in Example 2, it was determined for each specimen whether or not alignment is possible. The results thereof are shown in FIG. 12. From the results shown in FIG. 12, it was confirmed that alignment is not possible when the epitaxial growth temperature is 1,050° C. or 1,100° C. (the portion surrounded by the broken lines), regardless of the epitaxial growth rate, as in Example 2. As opposed to this, it was confirmed that alignment is possible when the epitaxial growth temperature is 1,150° C. or 1,180° C. and the epitaxial growth rate is 2.6 μm per minute or less.

Consequently, it was confirmed from the results shown in FIGS. 10 and 12 that it is possible to prevent both auto-doping and a breakdown in alignment mark form by second alignment mark 50 being formed in arsenic doped substrate 1, the epitaxial growth temperature when growing an epitaxial layer on the arsenic doped substrate 1 being 1,150° C. to 1,180° C., and the epitaxial growth rate being 2.2 μm per minute to 2.6 μm per minute (the portion surrounded by the heavy solid line in FIG. 12).

EXAMPLE 4

Next, verification was made of the relationship between the epitaxial growth temperature and the number of times an additional step for forming an alignment mark is carried out. FIG. 13 is a table showing the relationship between the epitaxial growth temperature and the number of additional alignment mark formation steps. Every time an epitaxial layer (the second to sixth epitaxial layers 2-2 to 2-6) with a thickness of 7 μm is grown after alignment mark 3-1 was formed in first epitaxial layer 2-1 with a thickness of 3 μm grown on the main surface of arsenic doped substrate 1, it was determined whether or not alignment is possible based on the alignment mark (alignment marks 3-2 to 3-6) formed in the outermost epitaxial layer.

In Example 4, three specimens were fabricated at epitaxial growth temperatures of 1,050° C., 1,100° C., and 1,150° C. (the invention). The alignment mark detection method and method of determining whether or not alignment is possible are the same as in Example 2. Second alignment mark 50 was formed as alignment mark 3-1 formed in first epitaxial layer 2-1. In FIG. 13, the results after the formation of the epitaxial layers as far as second to fourth epitaxial layers 2-2 to 2-4 are shown under the total thickness of the epitaxial layers (=3 μm+x layers×7 μm). In Example 4, the stacked number of layers of the five second to sixth epitaxial layers 2-2 to 2-6 grown on the surface of first epitaxial layer 2-1 is taken to be x.

As shown in FIG. 13, alignment already ceased to be possible after the first epitaxial layer formation when the epitaxial growth temperature was 1,050° C. Because of this, it was confirmed that when the epitaxial growth temperature is 1,050° C., it is necessary to carry out an additional step for forming an alignment mark every time an epitaxial layer is grown. Consequently, it was confirmed that an epitaxial growth temperature of 1,050° C. is not desirable (inapplicable) when forming parallel p-n layer 2 using multilayer epitaxial technology.

Also, when the epitaxial growth temperature was 1,100° C. (hereafter referred to as a comparison example), alignment was possible after the first epitaxial layer formation, but alignment was not possible after epitaxial layer formation from the second epitaxial layer onward. Because of this, it was confirmed that when the epitaxial growth temperature is 1,100° C., it is necessary to carry out an additional step for forming an alignment mark a total of five times when growing epitaxial layers until the total thickness is 38 μm (=3 μm+5 layers×7 μm).

Meanwhile, when the epitaxial growth temperature was 1,150° C. (hereafter referred to as Example 4), alignment was possible after the first epitaxial layer formation and after the second epitaxial layer formation. Because of this, it was confirmed that by adopting an epitaxial growth temperature of 1,150° C., it is sufficient to carry out an additional step for forming an alignment mark a total of only three times when growing epitaxial layers until the total thickness is 38 μm. Consequently, it was confirmed from the results shown in FIGS. 11 to 13 that, by adopting an epitaxial growth temperature of 1,150° C. or more, it is possible to reduce the number of times an additional step for forming an alignment mark is carried out in comparison with that heretofore known.

The occurrence of a breakdown in alignment mark form depends on the total thickness of the epitaxial layers. For example, even when the thickness of one epitaxial layer is, for example, 5 μm, the depth position at which a breakdown in alignment mark form occurs by the time the total thickness of the epitaxial layers reaches 38 μm is the same as in Example 4, wherein the thickness of one epitaxial layer is 7 μm. Consequently, when growing epitaxial layers until the total thickness reaches 38 μm, it is sufficient to carry out an additional step for forming an alignment mark a total of three times, regardless of the thickness of one epitaxial layer.

Figure 14:
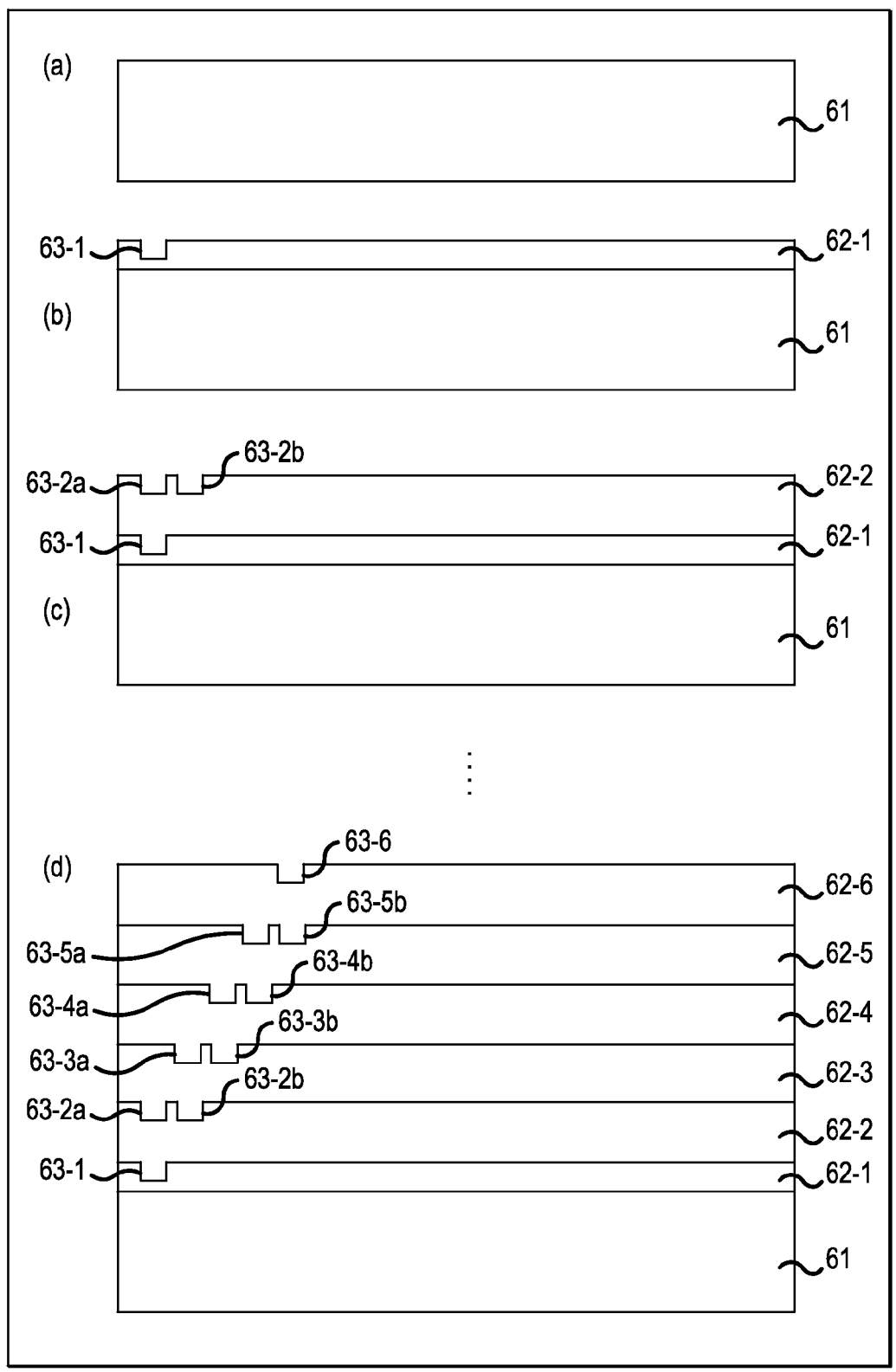
FIGS. 14A to 14D are sectional views showing conditions partway through the manufacture of a semiconductor device of a comparison example.

Next, a description will be given of one example of timings at which additional steps for forming alignment marks are carried out in Example 4 (when the epitaxial growth temperature is 1,150° C.) and the comparison example (when the epitaxial growth temperature is 1,100° C.). Firstly, a description will be given of the comparison example. FIGS. 14A to 14D are sectional views showing conditions partway through the manufacture of a semiconductor device of the comparison example. FIGS. 14A to 14D are main portion manufacturing step sectional views shown in step order. Manufacturing steps between FIGS. 14C and 14D are omitted from the drawing. A description of steps other than an epitaxial layer formation step and alignment mark formation step will be omitted (the same also applies in the case of the invention, to be described hereafter).

Firstly, arsenic doped substrate 61 is prepared (FIG. 14A), and first epitaxial layer 62-1 with a thickness of 3 μm is grown on a first main surface of arsenic doped substrate 61. Next, alignment mark 63-1 is formed in first epitaxial layer 62-1 in an additional step (first time) for forming an alignment mark. The condition thus far is shown in FIG. 14B. Next, second epitaxial layer 62-2 is grown on the surface of first epitaxial layer 62-1. Alignment mark 63-2a is formed in second epitaxial layer 62-2 by second epitaxial layer 62-2 surface being depressed in accordance with alignment mark 63-1 of first epitaxial layer 62-1.

Next, alignment mark 63-2b is newly formed in a position in second epitaxial layer 62-2 differing from that of alignment mark 63-2a in an additional step (second time) for forming an alignment mark. That is, the condition is such that two alignment marks 63-2a and 63-2b are formed in second epitaxial layer 62-2. Alignment is carried out using alignment mark 63-2a in the additional step for forming alignment mark 63-2b. The condition thus far is shown in FIG. 14C.

The reason for newly forming alignment mark 63-2b in second epitaxial layer 62-2 at this point is as follows. As heretofore described, a breakdown in alignment mark form occurs in the comparison example after the formation of the second epitaxial layer. Third epitaxial layer 62-3, to be described hereafter, grown on the surface of second epitaxial layer 62-2 forms the second epitaxial layer in which the breakdown in alignment mark form occurs. Because of this, when third epitaxial layer 62-3 is grown on the surface of second epitaxial layer 62-2 as it is, only alignment marks in which a breakdown in form has occurred are formed in third epitaxial layer 62-3 and in a plurality of epitaxial layers further stacked on third epitaxial layer 62-3, and subsequent alignment is not possible.

Next, third epitaxial layer 62-3 with a thickness of 7 μm is grown on the surface of second epitaxial layer 62-2. Two alignment marks (of the two alignment marks, one is not shown, while the other is shown by reference sign 63-3a) are formed in third epitaxial layer 62-3 by third epitaxial layer 62-3 surface being depressed in accordance with alignment marks 63-2a and 63-2b of second epitaxial layer 62-2. As heretofore described, of the two alignment marks of third epitaxial layer 62-3, a breakdown in form occurs in the alignment mark formed above alignment mark 63-1 of first epitaxial layer 62-1 (alignment mark 63-2a of second epitaxial layer 62-2).

Meanwhile, of the two alignment marks of third epitaxial layer 62-3, no breakdown in form occurs in the alignment mark 63-3a formed above alignment mark 63-2b of second epitaxial layer 62-2. The reason for this is that, as alignment mark 63-2b of second epitaxial layer 62-2 is formed in an additional step for forming an alignment mark, it is possible to see third epitaxial layer 62-3 as being the first epitaxial layer formed above alignment mark 63-2b of second epitaxial layer 62-2. Next, alignment mark 63-3b is newly formed in third epitaxial layer 62-3 in an additional step (third time) for forming an alignment mark. Alignment is carried out using alignment mark 63-3a, in which no breakdown in form has occurred, in the additional step for forming alignment mark 63-3b.

Subsequently, fourth to sixth epitaxial layers 62-4 to 62-6 are grown sequentially to a thickness of 7 μm each on the surface of third epitaxial layer 62-3. In fourth epitaxial layer 62-4 too, for the same reason as when growing third epitaxial layer 62-3, it is only in alignment mark 63-4a formed in accordance with alignment mark 63-3b of third epitaxial layer 62-3 that no breakdown in form occurs. Because of this, alignment mark 63-4b is newly formed in fourth epitaxial layer 62-4 in an additional step (fourth time) for forming an alignment mark. Alignment is carried out using alignment mark 63-4a, in which no breakdown in form has occurred, in the additional step for forming alignment mark 63-4b.

Also, in fifth epitaxial layer 62-5 too, for the same reason as when growing third epitaxial layer 62-3, it is only in alignment mark 63-5a formed in accordance with alignment mark 63-4b of fourth epitaxial layer 62-4 that no breakdown in form occurs. Because of this, alignment mark 63-5b is newly formed in fifth epitaxial layer 62-5 in an additional step (fifth time) for forming an alignment mark. Alignment is carried out using the alignment mark 63-5a, in which no breakdown in form has occurred, in the additional step for forming the alignment mark 63-5b. Alignment mark 63-6 in which no breakdown in form occurs is formed in accordance with the alignment mark 63-5b of fifth epitaxial layer 62-5 in sixth epitaxial layer 62-6, which is deposited last.

Figure 15:
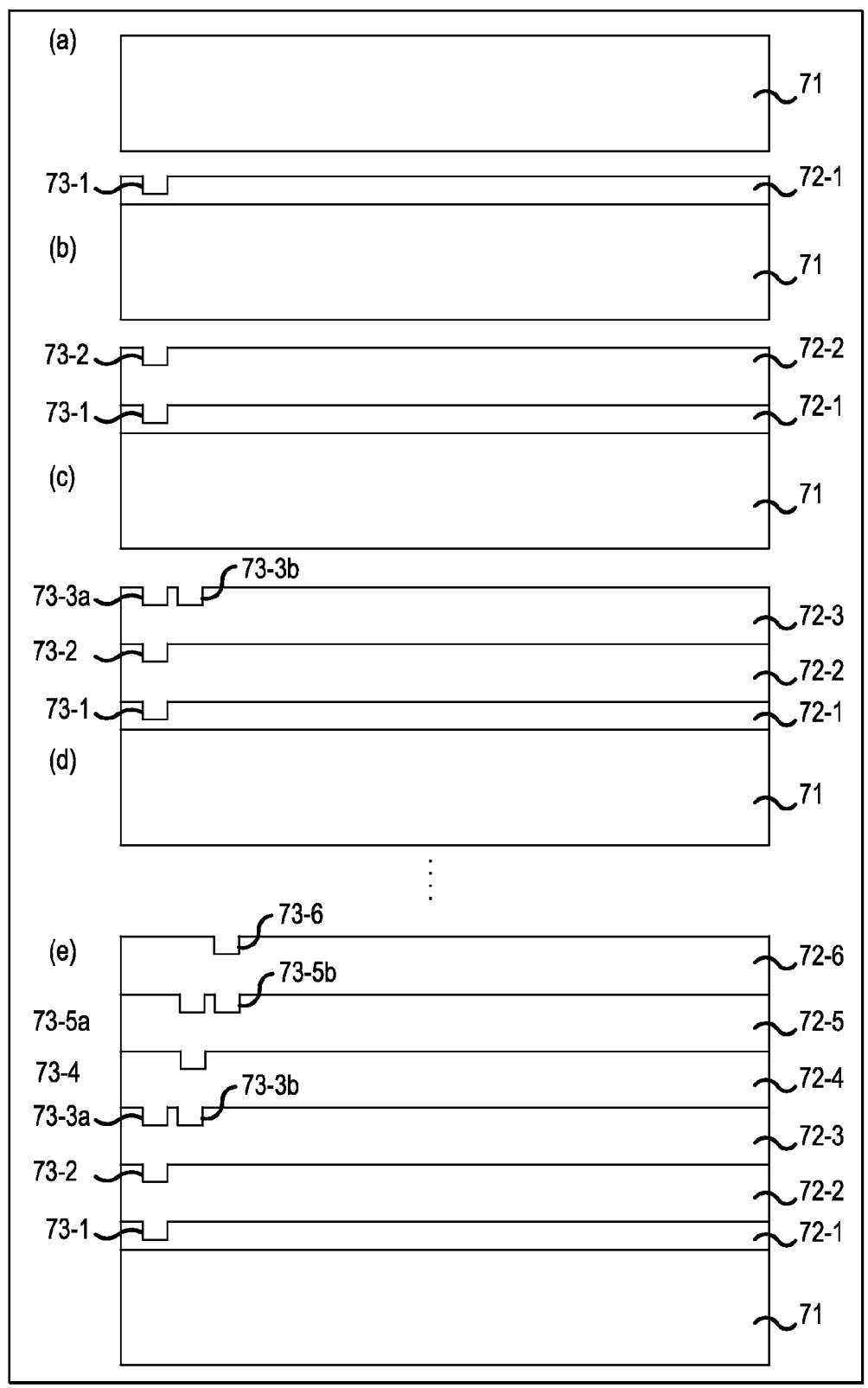
FIGS. 15A to 15E are sectional views showing conditions partway through the manufacture of a semiconductor device according to the invention.

As opposed to this, in Example 4, additional steps for forming alignment marks are carried out at, for example, the following timings. FIGS. 15A to 15E are sectional views showing conditions partway through the manufacture of a semiconductor device according to the invention. FIGS. 15A to 15E are main portion manufacturing step sectional views shown in step order. Manufacturing steps between FIGS. 15D and 15E are omitted from the drawing.

Firstly, arsenic doped substrate 71 is prepared (FIG. 15A), and first epitaxial layer 72-1 with a thickness of 3 μm is grown on a first main surface of arsenic doped substrate 71. Next, alignment mark 73-1 is formed in first epitaxial layer 72-1 in an additional step (first time) for forming an alignment mark. The condition thus far is shown in FIG. 15B. Next, second epitaxial layer 72-2 is grown to a thickness of 7 μm on the surface of first epitaxial layer 72-1. Alignment mark 73-2 is formed in second epitaxial layer 72-2 by second epitaxial layer 72-2 surface being depressed in accordance with alignment mark 73-1 of first epitaxial layer 72-1. The condition thus far is shown in FIG. 15C.

Next, continuing on from the formation of second epitaxial layer 72-2, third epitaxial layer 72-3 with a thickness of 7 μm is formed on the surface of second epitaxial layer 72-2. Alignment mark 73-3a is formed in third epitaxial layer 72-3 by third epitaxial layer 72-3 surface being depressed in accordance with alignment mark 73-2 of second epitaxial layer 72-2. Next, alignment mark 73-3b is newly formed in a position in third epitaxial layer 72-3 differing from that of alignment mark 73-3a in an additional step (second time) for forming an alignment mark. That is, the condition is such that two alignment marks 73-3a and 73-3b are formed in third epitaxial layer 72-3. Alignment is carried out using alignment mark 73-3a in the additional step for forming alignment mark 73-3b. The condition thus far is shown in FIG. 15D.

The reason for depositing second and third epitaxial layers 72-2 and 72-3 consecutively, and the reason for newly forming alignment mark 73-3b in third epitaxial layer 72-3, are that, as heretofore described, the invention is such that a breakdown in alignment mark form occurs after the formation of the third epitaxial layer. That is, second and third epitaxial layers 72-2 and 72-3 form the first and second epitaxial layers above alignment mark 73-1 of first epitaxial layer 72-1. Because of this, no breakdown in alignment mark form occurs in second and third epitaxial layers 72-2 and 72-3. Consequently, second and third epitaxial layers 72-2 and 72-3 may be deposited consecutively.

Meanwhile, fourth epitaxial layer 72-4, to be described hereafter, grown on the surface of third epitaxial layer 72-3 forms the third epitaxial layer, in which the breakdown in alignment mark form occurs. Because of this, when fourth epitaxial layer 72-4 is grown on the surface of third epitaxial layer 72-3 as it is, only alignment marks in which a breakdown in form has occurred are formed in fourth epitaxial layer 72-4 and in a plurality of epitaxial layers further stacked on fourth epitaxial layer 72-4, and subsequent alignment is not possible.

Next, fourth epitaxial layer 72-4 with a thickness of 7 μm is formed on the surface of third epitaxial layer 72-3. Two alignment marks (of the two alignment marks, one is not shown, while the other is shown by reference sign 73-4) are formed in fourth epitaxial layer 72-4 by fourth epitaxial layer 72-4 surface being depressed in accordance with alignment marks 73-3a and 73-3b of third epitaxial layer 72-3. As heretofore described, of the two alignment marks of fourth epitaxial layer 72-4, a breakdown in form occurs in the alignment mark formed above alignment mark 73-1 of first epitaxial layer 72-1 (alignment mark 73-3a of third epitaxial layer 72-3).

Meanwhile, of the two alignment marks of fourth epitaxial layer 72-4, no breakdown in form occurs in alignment mark 73-4 formed above alignment mark 73-3b of third epitaxial layer 72-3. The reason for this is that, as alignment mark 73-3b of third epitaxial layer 72-3 is formed in an additional step for forming an alignment mark, it is possible to see fourth epitaxial layer 72-4 as being the first epitaxial layer formed above alignment mark 73-3b of third epitaxial layer 72-3.

Next, continuing on from the formation of fourth epitaxial layer 72-4, fifth epitaxial layer 72-5 with a thickness of 7 μm is formed on the surface of fourth epitaxial layer 72-4. Alignment mark 73-5a is formed in fifth epitaxial layer 72-5 by fifth epitaxial layer 72-5 surface being depressed in accordance with alignment mark 73-4, in which no breakdown in form has occurred, of fourth epitaxial layer 72-4. Although omitted from the drawing, an alignment mark (not shown) formed in accordance with an alignment mark (not shown) of fourth epitaxial layer 72-4 in which a breakdown in form has occurred is also formed in fifth epitaxial layer 72-5.

Next, alignment mark 73-5b is newly formed in fifth epitaxial layer 72-5 in an additional step (third time) for forming an alignment mark. Alignment is carried out using alignment mark 73-5a, in which no breakdown in form has occurred, in the additional step for forming alignment mark 73-5b. The reason for newly forming alignment mark 73-5b in fifth epitaxial layer 72-5 is that sixth epitaxial layer 72-6, to be described hereafter, grown on the surface of fifth epitaxial layer 72-5 forms the third epitaxial layer in which a breakdown in alignment mark form occurs. Alignment mark 73-6 in which no breakdown in form occurs is formed in accordance with alignment mark 73-5b of fifth epitaxial layer 72-5 in sixth epitaxial layer 72-6, which is deposited last.

Figure 16:
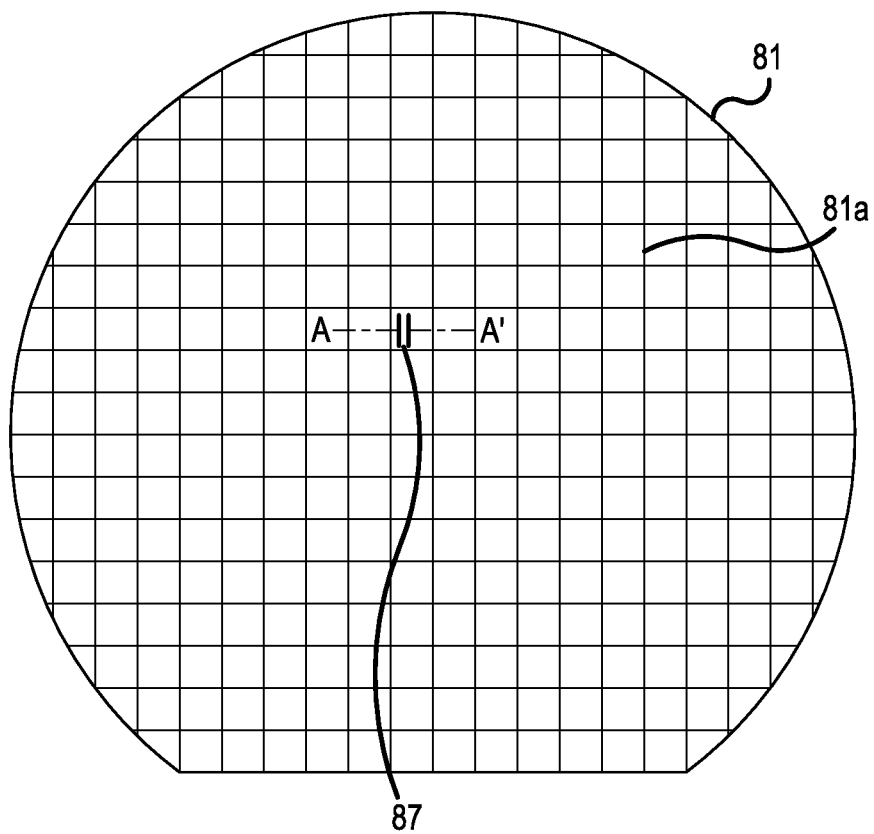
FIG. 16 is a plan view showing one example of a semiconductor wafer in which a semiconductor device is fabricated using the semiconductor device manufacturing method according to the invention.
Figure 17:
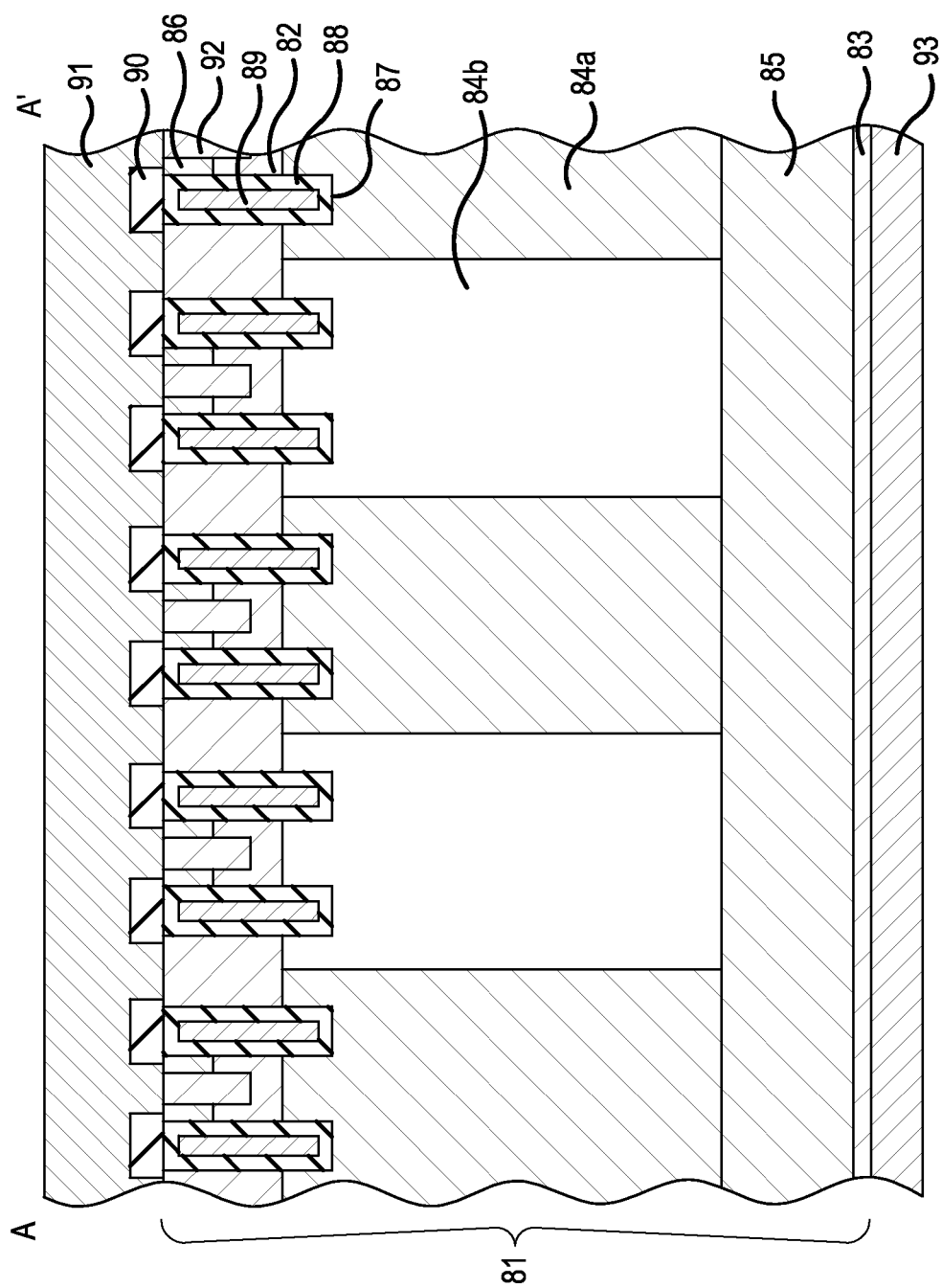
FIG. 17 is a sectional view showing a sectional structure along a cutting plane line A-A' of FIG. 16.

Next, a description will be given of a trench gate structure semiconductor device as an example of a semiconductor device fabricated using the semiconductor device manufacturing method according to the invention. FIG. 16 is a plan view showing one example of a semiconductor wafer in which a semiconductor device is fabricated using the semiconductor device manufacturing method according to the invention. FIG. 17 is a sectional view showing a sectional structure along a cutting plane line A-A' of FIG. 16. As shown in FIGS. 16 and 17, the trench gate structure semiconductor device according to the invention is formed in a region enclosed by scribe lines 81a, formed in lattice form in semiconductor wafer 81, so that the side walls of trench 87 are parallel to scribe lines 81a. Also, second alignment mark 50 (refer to FIG. 9) is formed in a predetermined position in semiconductor wafer 81, and trench 87 side walls are formed so as to be parallel to the side walls of grooves 51 configuring second alignment mark 50.

This kind of trench gate structure semiconductor device is such that p-channel layer 82 and high concentration n-type drain layer 83 are provided in a first main surface side surface region and second main surface side surface region respectively of an n-type main semiconductor layer (hereafter referred to as n-type main semiconductor layer 81) formed of semiconductor wafer 81. A region between p-channel layer 82 and n-type drain layer 83 in n-type main semiconductor layer 81 forms n-type semiconductor layer 84a and p-type semiconductor layer 84b. N-type semiconductor layer 84a and p-type semiconductor layer 84b are repeatedly alternately provided in, for example, a striped form in a direction parallel to the first main surface of n-type main semiconductor layer 81. N⁻ type buffer layer 85 of an impurity concentration lower than that of the n-type semiconductor layer 84a is provided between n-type semiconductor layer 84a and p-type semiconductor layer 84b and n-type drain layer 83.

N⁺ source region 86 and p⁺ type body region 92 are selectively provided in a surface region of p-channel layer 82. A plurality of the trench 87 are provided in a striped form in the first main surface side surface region of n-type main semiconductor layer 81. Each trench 87 is adjacent to n⁺ source region 86, and penetrates p-channel layer 82 from the first main surface of n-type main semiconductor layer 81, reaching n-type semiconductor layer 84a or p-type semiconductor layer 84b. Gate electrode 89 is provided across gate dielectric 88 in each trench 87.

Interlayer dielectric 90 is provided on the first main surface of n-type main semiconductor layer 81 so as to cover gate electrode 89. Source electrode 91 formed of a metal film is provided on the first main surface of n-type main semiconductor layer 81 so as to cover interlayer dielectric 90 and come into contact with n⁺ source region 86 and p⁺ type body region 92. Source electrode 91 is electrically connected to p-channel layer 82 via p⁺ type body region 92. Drain electrode 93 formed of a metal film is provided on the surface of n-type drain layer 83. A passivation film such as a nitride film, an amorphous silicon film, or a polyimide film may be provided on source electrode 91, but is omitted from FIG. 17.

As heretofore described, according to the embodiment, it is possible to prevent auto-doping by epitaxial layers being grown on the main surface of an arsenic doped substrate at atmospheric pressure, with the epitaxial growth temperature at 1,150° C. to 1,180° C., and the epitaxial growth rate at 2.2 μm per minute to 2.6 μm per minute. Also, it is possible to prevent a breakdown in the form of an alignment mark newly formed in an epitaxial layer grown on the main surface of an arsenic doped substrate in which an alignment mark is formed. Consequently, it is possible to improve a trade-off relationship between auto-doping and breakdown in alignment mark form. Also, according to the embodiment, it being possible to prevent breakdown in alignment mark form means that it is possible to reduce the number of times an additional step for forming an alignment mark is carried out. Because of this, it is possible to improve productivity.

Also, according to the embodiment, its being possible to prevent auto-doping means that it is possible when, for example, forming a parallel p-n layer to improve the controllability of the impurity ratio (p/n ratio) between a p-type semiconductor layer and n-type semiconductor layer of the parallel p-n layer. Also, according to the embodiment, it being possible to prevent auto-doping means that it is possible to fabricate a semiconductor device using an arsenic doped substrate doped with a high concentration of arsenic. Because of this, it is possible to omit back surface processes, such as an implantation of ions into the substrate back surface and an annealing process in order to obtain an ohmic contact, and thus possible to reduce the number of steps.

Heretofore, the invention has been described with a case of forming a parallel p-n layer as an example but, not being limited to the heretofore described embodiment, the invention can be applied to various devices fabricated by stacking epitaxial layers using multilayer epitaxial technology. Also, in the heretofore described embodiment, a first alignment mark is formed in a first epitaxial layer on the main surface of an arsenic doped substrate in an additional step for forming an alignment mark but, this is not construed as limitation thereto, the first alignment mark may be formed in, for example, the arsenic doped substrate. The invention has been described giving as an example a case wherein an alignment mark having a striped planar form and a depressed sectional form is formed, but the form of the alignment mark can be variously changed in accordance with design conditions.

For example, the planar form of the alignment mark may be a cross form. In this case, the alignment mark may be configured of grooves of a configuration such that grooves with the Si {110} plane as side walls and grooves with the Si {100} plane as side walls intersect. Also, the sectional form of the alignment mark may be a protruding form. In this case, the alignment mark may be configured of a protruding portion with the Si {100} plane as a top planar surface and the Si {110} plane or the Si{100} plane as a side surface.

Also, the invention is such that first and second ion implantations are carried out after an intrinsic epitaxial layer is grown on the main surface of an arsenic doped substrate, thereby forming an n-type implant region and a p-type implant region but, this is not construed as limitation thereto, after an n-type epitaxial layer, for example, is grown on the main surface of the arsenic doped substrate, the second ion implantation for forming the p-type implant region may be carried out alone. Also, in the embodiment, the first conductivity type is the n-type while the second conductivity type is the p-type, but the invention is established in the same way when the first conductivity type is the p-type and the second conductivity type is the n-type.

In this way, the semiconductor device manufacturing method according to the invention is useful in a power semiconductor device used in a power supply device, or the like, of a power conversion device, various industrial machines, and the like.

Thus, a semiconductor device manufacturing method has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device manufacturing method, comprising:
   a first step of forming a first alignment mark in one portion of a semiconductor substrate doped with $1.0 \times 10^{19}/cm^3$ or more of arsenic; and
   a second step of forming a second alignment mark by an epitaxial layer being grown on a main surface of the semiconductor substrate, and a portion of the epitaxial layer above the first alignment mark being transformed in accordance with the first alignment mark,
   wherein the epitaxial layer is grown in the second step at atmospheric pressure using trichlorosilane as a raw material gas, with an epitaxial growth temperature of 1,150° C. to 1,180° C., and an epitaxial growth rate of 2.2 μm per minute to 2.6 μm per minute.

2. The semiconductor device manufacturing method according to claim 1, wherein
   the first alignment mark formed in one portion of the semiconductor substrate in the first step is of a depressed form,
   the main surface of the semiconductor substrate is the {100} plane, and
   the bottom surface of the first alignment mark is the {100} plane.

3. The semiconductor device manufacturing method according to claim 2, wherein the first alignment mark formed in one portion of the semiconductor substrate in the first step is of a depressed form, the main surface of the semiconductor substrate is the {100} plane, and the side surface of the first alignment mark is the {100} plane.

4. The semiconductor device manufacturing method according to claim 1, wherein the first alignment mark formed in one portion of the semiconductor substrate in the first step is of a depressed form, the main surface of the semiconductor substrate is the {100} plane, and the side surface of the first alignment mark is the {100} plane.

5. The semiconductor device manufacturing method according to claim 4, further comprising a third step of, after the second step, forming a trench in the epitaxial layer in accordance with the second alignment mark, and forming an insulated gate structure inside the trench.

6. The semiconductor device manufacturing method according to claim 5, wherein the trench is formed in the third step so that the side surface of the trench is the {100} plane.

7. The semiconductor device manufacturing method according to claim 5, further comprising
   a fourth step of, after the second step and before the third step, introducing a first conductivity type impurity into the epitaxial layer, and furthermore, selectively introducing a second conductivity type impurity, wherein
   the thickness of the epitaxial layer is increased by repeatedly carrying out the second step and fourth step, and a parallel p-n junction structure is formed with a configuration wherein a first conductivity type semiconductor region and a second conductivity type semiconductor region are repeatedly alternately joined.

8. The semiconductor device manufacturing method according to claim 1, wherein the semiconductor substrate is a substrate wherein a first conductivity type epitaxial layer is deposited on a semiconductor wafer doped with arsenic to a dose of $1.0 \times 10^{19}/cm^3$ or more.

9. The semiconductor device manufacturing method according to claim 8, comprising:

a first repeat step of repeatedly carrying out the second step, thereby forming the epitaxial layer to a thickness of 14 μm or less; and a third step of, after the second step, selectively introducing a second conductivity type impurity into the epitaxial layer using the second alignment mark.

10. The semiconductor device manufacturing method according to claim 1, comprising:

a first repeat step of repeatedly carrying out the second step, thereby forming the epitaxial layer to a thickness of 14 μm or less; and a third step of, after the second step, selectively introducing a second conductivity type impurity into the epitaxial layer using the second alignment mark.

11. The semiconductor device manufacturing method according to claim 10, comprising:

a fourth step of, after the first repeat step, forming a third alignment mark on the surface of the epitaxial layer using the second alignment mark; and a fifth step of forming a fourth alignment mark by an epitaxial layer being further grown on the surface of the epitaxial layer in which the third alignment mark has been formed, and a portion of the epitaxial layer above the third alignment mark being transformed in accordance with the third alignment mark, wherein the epitaxial layer is grown in the fifth step at atmospheric pressure using trichlorosilane as a raw material gas, with an epitaxial growth temperature of 1,150° C. to 1,180° C., and an epitaxial growth rate of 2.2 μm per minute to 2.6 μm per minute.

12. The semiconductor device manufacturing method according to claim 11, comprising:

a second repeat step of repeatedly carrying out the fifth step, thereby forming an epitaxial layer to a thickness of 14 μm or less on the surface of the epitaxial layer in which the third alignment mark has been formed; and a sixth step of, after the fifth step, selectively introducing a second conductivity type impurity using the fourth alignment mark.

13. The semiconductor device manufacturing method according to claim 12, wherein the thickness of the epitaxial layer is increased by carrying out the third step after each second step and carrying out the sixth step after each fifth step, and a parallel p-n junction structure is formed with a configuration wherein a first conductivity type semiconductor region and a second conductivity type semiconductor region are repeatedly alternately joined.

* * * * *